United States Patent
Rocklein et al.

(10) Patent No.: US 9,466,660 B2
(45) Date of Patent: Oct. 11, 2016

(54) SEMICONDUCTOR STRUCTURES INCLUDING MOLYBDENUM NITRIDE, MOLYBDENUM OXYNITRIDE OR MOLYBDENUM-BASED ALLOY MATERIAL, AND METHOD OF MAKING SUCH STRUCTURES

(71) Applicant: Micron Technology, Inc., Boise, ID (US)

(72) Inventors: Matthew N. Rocklein, Boise, ID (US); Kotha Sai Madhukar Reddy, Boise, ID (US); Vassil Antonov, Boise, ID (US); Vishwanath Bhat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/055,620

(22) Filed: Oct. 16, 2013

(65) Prior Publication Data
US 2015/0102460 A1 Apr. 16, 2015

(51) Int. Cl.
*H01L 29/12* (2006.01)
*H01L 49/02* (2006.01)

(52) U.S. Cl.
CPC .............. *H01L 28/60* (2013.01); *H01L 28/40* (2013.01)

(58) Field of Classification Search
CPC ...... H01L 21/238; H01L 28/40; H01L 28/60
See application file for complete search history.

(56) References Cited

U.S. PATENT DOCUMENTS

| | | | |
|---|---|---|---|
| 5,187,557 A * | 2/1993 | Zenke | H01L 28/60 257/310 |
| 5,520,992 A | 5/1996 | Douglas et al. | |
| 6,114,200 A * | 9/2000 | Yew et al. | 438/253 |
| 6,255,187 B1 * | 7/2001 | Horii | 438/396 |
| 6,294,420 B1 | 9/2001 | Tsu et al. | |
| 8,415,227 B2 | 4/2013 | Malhotra et al. | |
| 8,435,854 B1 | 5/2013 | Malhotra et al. | |
| 8,530,348 B1 | 9/2013 | Malhotra et al. | |

(Continued)

FOREIGN PATENT DOCUMENTS

| KR | 10-2012-0134458 A | 12/2012 |
|---|---|---|
| TW | 400601 B | 8/2000 |

OTHER PUBLICATIONS

Schaeffer et al., Application of Group Electronegativity Concepts to the Effective Work Functions of Metal Gate Electrodes on High-K Gate Oxides, Microelectronic Engineering, vol. 84, (2007), pp. 2196-2200.

(Continued)

*Primary Examiner* — Marc Armand
*Assistant Examiner* — Sarah Salerno
(74) *Attorney, Agent, or Firm* — TraskBritt (57) ABSTRACT

A semiconductor structure may include a first electrode over a substrate, a high-K dielectric material over the first electrode, and a second electrode over the high-K dielectric material, wherein at least one of the first electrode and the second electrode may include a material selected from the group consisting of a molybdenum nitride ($Mo_aN_b$) material, a molybdenum oxynitride ($MoO_xN_y$) material, a molybdenum oxide ($MoO_x$) material, and a molybdenum-based alloy material comprising molybdenum and nitrogen.

15 Claims, 4 Drawing Sheets

(56) References Cited

U.S. PATENT DOCUMENTS

| | | |
|---|---|---|
| 8,581,363 B2 | 11/2013 | Yoon |
| 2005/0017286 A1 | 1/2005 | Yeo et al. |
| 2007/0096189 A1 | 5/2007 | Iwasaki et al. |
| 2009/0065896 A1 | 3/2009 | Hwang |
| 2009/0194410 A1 | 8/2009 | Schroeder et al. |
| 2011/0057292 A1 | 3/2011 | Hu |
| 2012/0214288 A1 | 8/2012 | Chen et al. |
| 2012/0262835 A1* | 10/2012 | Ramani .................. H01L 28/60 361/271 |
| 2012/0322221 A1 | 12/2012 | Chen et al. |
| 2013/0056851 A1 | 3/2013 | Chen et al. |
| 2013/0119512 A1 | 5/2013 | Malhotra et al. |
| 2013/0122681 A1 | 5/2013 | Malhotra et al. |

OTHER PUBLICATIONS

International Search Report of the ISA/KR, International Application No. PCT/US2014/060030, mailed Jan. 21, 2015, three (3) pages.

Written Opinion of the International Search Authority, ISA/KR, International Application No. PCT/US2014/060030, mailed Jan. 21, 2015, six (6) pages.

Taiwan Search Report from Taiwan Application No. 103135885, dated Apr. 15, 2016, 1 page.

* cited by examiner

SEMICONDUCTOR STRUCTURES INCLUDING MOLYBDENUM NITRIDE, MOLYBDENUM OXYNITRIDE OR MOLYBDENUM-BASED ALLOY MATERIAL, AND METHOD OF MAKING SUCH STRUCTURES

FIELD

The present disclosure, in various embodiments, relates generally to semiconductor structures including a molybdenum nitride material, a molybdenum oxynitride material or a molybdenum-based alloy material, to methods making such structures, and to devices including such structures. More particularly, the present disclosure relates to semiconductor structures that include an electrode comprising a molybdenum nitride material, a molybdenum oxynitride material or a molybdenum-based alloy material, to methods making such electrodes, and to devices including such electrodes.

BACKGROUND

Memory devices, such as Dynamic Random Access Memory (DRAM), utilize capacitors to store information within an integrated circuit. A capacitor is formed by placing a dielectric material between two electrodes formed from conductive materials. A continuing goal for memory devices is to decrease the dimensions of the devices while maintaining or increasing the storage capacity of the devices.

Capacitance (C) is an ability of a capacitor to hold electrical charge. Capacitance (C) is a function of the surface area of the capacitor (A), the distance between the capacitors (d) (i.e., the physical thickness of the dielectric material), and the relative dielectric constant (i.e., k value) of the dielectric material, as shown in the equation below where $\varepsilon_o$ represents the vacuum permittivity:

$$C = k\,\varepsilon_o \cdot \frac{A}{d}$$

In order to enhance a capacitance value without increasing the dimensions (e.g., area A) of an electrode, it is necessary to decrease the thickness (d) of the dielectric material or to use a dielectric material having a high dielectric constant (k). Reducing the thickness (d) of the dielectric material may result in current leakage, which exponentially increases as the thickness of the dielectric material decreases. It is, therefore, desirable to use a dielectric material with a high k value to achieve high capacitance.

For a given desired capacitance, if the k value of the dielectric material is increased, the dimensions of the capacitor may be decreased while maintaining the same cell capacitance. High-K dielectric materials are dielectric materials having a high dielectric constant (k) of about 20, as compared to silicon dioxide ($SiO_2$), which has a dielectric constant of about 4. Therefore, a capacitor with the same or increased capacitance can be obtained by using a high-K dielectric material, instead of $SiO_2$, as the dielectric material between the two electrodes of the capacitor. Examples of high-K dielectric materials are zirconium dioxide ($ZrO_2$), hafnium dioxide ($HfO_2$), $SrTiO_3$, hafnium silicate or zirconium silicate, among others.

However, high-K dielectric materials also have smaller band gaps and smaller conduction band offsets with respect to the metal electrode, compared to $SiO_2$. Consequentially, the capacitors having high-K dielectric materials typically suffer from current leakage more than the capacitors having $SiO_2$ as a dielectric material.

Accordingly, there is a need for an electrode and a semiconductor structure including such electrode that have high capacitance and work function, but low current leakage.

DETAILED DESCRIPTION

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming a semiconductor device structure, and the semiconductor device structures described below do not form a complete semiconductor device. Only those process acts and structures necessary to understand the embodiments of the present disclosure are described in detail below. Additional acts to form the complete semiconductor device may be performed by conventional fabrication techniques. Also, the drawings accompanying the application are for illustrative purposes only, and are thus not necessarily drawn to scale. Elements common between figures may retain the same numerical designation. Furthermore, while the materials described and illustrated herein may be formed as layers, the materials are not limited thereto and may be formed in other three-dimensional configurations.

As used herein, any relational terms, such as "top," "bottom," "upper" and "lower," are used for clarity and convenience in understanding the present disclosure and accompanying drawings and does not connote or depend on any specific preference, orientation or order. It is understood that, although the terms "top," "bottom," "upper" and "lower" are used herein to describe various elements, these elements should not be limited by these terms. These terms are only used to distinguish one element from another.

As used herein, the term "substantially," in reference to a given parameter, property or condition, means to a degree that one of ordinary skill in the art would understand that the given parameter, property, or condition is met with a small degree of variance, such as within acceptable manufacturing tolerances.

As used herein, the term "substrate" means and includes a base material or construction upon which additional materials are formed. The substrate may be, for example, a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in the base semiconductor structure or foundation. In one embodiment, the substrate is a silicon-containing material, such as a silicon substrate.

As used herein, the term "high-K dielectric material" means and includes a dielectric material having a dielectric constant value of at least about 20. The high-K dielectric material may be a non-conducting metal oxide, a non-conducting metal nitride, a non-conducting metal silicate or combinations thereof. Non-limiting examples of high-K dielectric materials may include $ZrO_2$, $HfO_2$, $SrTiO_3$, $TiO_2$, $BaSrTiO_x$, $HfSiO_x$, $Nb_2O_5$, $PbZrTiO_x$, SiON, $Ta_2O_5$, or combinations thereof. When desired, the high-K dielectric materials may include a dopant. Non-limiting examples of the dopant may include Al, Ce, Co, Er, Ga, Gd, Ge, Hf, In, La, Lu, Mg, Mn, Nd, Pr, Sc, Si, Sn, Sr, Y, Zr, or combinations thereof.

The semiconductor structure may include an electrode comprising a material selected from the group consisting of a molybdenum oxynitride ($MoO_xN_y$) material, a molybdenum nitride ($Mo_aN_b$) material, and a molybdenum (Mo)-based alloy material. The values of x and y each may be from about 0.01 to about 2, and the values of a and b each may be from about 0.5 to about 2. The $MoO_xN_y$ material, $Mo_aN_b$ material, or molybdenum (Mo)-based alloy material may be stoichiometric or non-stoichiometric materials.

As used herein, the term "molybdenum-based alloy material" means and includes an alloy material comprising molybdenum and nitrogen elements. Non-limiting examples of a Mo-based alloy material may include MoAlN, MoAlON, MoTiN, MoAlTiN, MoNbN, MoZrN, MoSiN, MoTaN, MoHfN, or combinations thereof.

Figure 1:
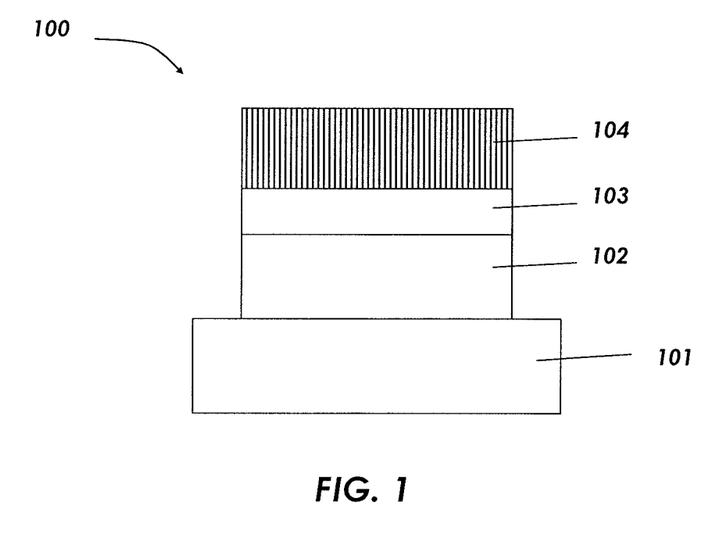
FIGS. 1-8 each illustrate, in schematic view, a non-limiting example of a semiconductor structure in accordance with an embodiment of the present disclosure.

FIG. 1 shows one embodiment of a semiconductor structure 100. The semiconductor structure 100 may include a substrate 101, a bottom electrode 102 over the substrate 101, a top electrode 104, and a high-K dielectric material 103 between the bottom electrode 102 and the top electrode 104. The top electrode 104 may include $MoO_xN_y$ material, $Mo_aN_b$ material, or Mo-based alloy material. The bottom electrode 102 may include any conventional electrode material. By way of non-limiting examples, the electrode material may include metals such as ruthenium (Ru); conductive metal oxides such as ruthenium dioxide ($RuO_2$), iridium oxide ($IrO_2$), molybdenum oxide ($MoO_x$), tungsten oxide, chromium oxide, manganese oxide, tin oxide, and cobalt oxide; conductive metal silicides; conductive metal nitrides such as titanium nitride (TiN) and tantalum nitride (TaN); or combinations thereof. Any conventional high-K dielectric material may be used for the high-K dielectric material 103.

The bottom electrode 102 may be formed over the substrate 101, and then the high-K dielectric material 103 may be formed over the bottom electrode 102. Optionally, the bottom electrode 102 may be subjected to an annealing process prior to the formation of the high-K dielectric material 103. The top electrode 104 may then be formed over the high-K dielectric material 103 to provide the semiconductor structure 100. Those skilled in the art appreciate that each of the bottom electrode 102, the high-K dielectric material 103, and the top electrode 104 may be formed using conventional techniques and, therefore, is not described in detail herein. Non-limiting examples of the conventional techniques may include atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD).

Figure 2:
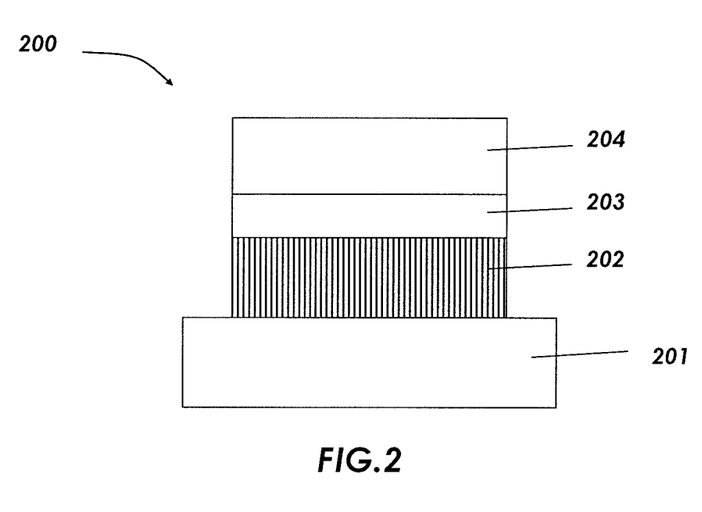

FIG. 2 shows another embodiment of a semiconductor structure 200. The semiconductor structure 200 may include a substrate 201, a bottom electrode 202 over the substrate 201, a top electrode 204, and a high-K dielectric material 203 between the bottom electrode 202 and the top electrode 204. The bottom electrode 202 may be formed over the substrate 201. The bottom electrode 202 may include $MoO_xN_y$ material, $Mo_aN_b$ material, $MoO_x$ material such as molybdenum dioxide ($MoO_2$), or Mo-based alloy material. Then, the high-K dielectric material 203 may be formed over the bottom electrode 202. The high-K dielectric material 203 may be any conventional high-K dielectric material. Optionally, the bottom electrode 202 may be subjected to an annealing process prior to the formation of the high-K dielectric material 203. The top electrode 204 may be formed over the high-K dielectric material 203 to provide the semiconductor structure 200. The top electrode 204 may be any conventional electrode material. Those skilled in the art appreciate that each of the bottom electrode 202, the high-K dielectric material 203, and the top electrode 204 may be formed using conventional techniques and, therefore, is not described in detail herein.

Figure 3:
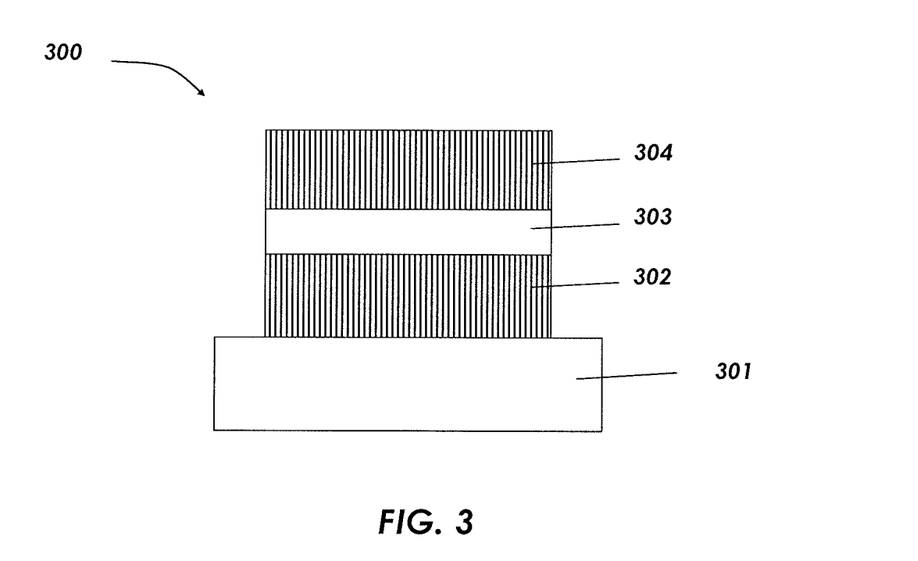

FIG. 3 shows yet another embodiment of a semiconductor structure 300. The semiconductor structure 300 may include a substrate 301, a bottom electrode 302 over the substrate 301, a top electrode 304, and a high-K dielectric material 303 between the bottom electrode 302 and the top electrode 304. The bottom electrode 302 may be formed over the substrate 301. The bottom electrode 302 may include $MoO_xN_y$ material, $Mo_aN_b$ material, $MoO_x$ material, or Mo-based alloy material. Then, the high-K dielectric material 303 may be formed over the bottom electrode 302. The high-K dielectric material 303 may be any conventional high-K dielectric material. Optionally, the bottom electrode 302 may be subjected to an annealing process prior to the formation of the high-K dielectric material 303. The top electrode 304 may be formed over the high-K dielectric material 303 to provide the semiconductor structure 300. The top electrode 304 may include $MoO_xN_y$ material, $Mo_aN_b$ material, $MoO_x$ material, or Mo-based alloy material. The bottom electrode 302 may be formed of the same material as the top electrode 304, thus the semiconductor structure 300 may have a symmetric stack structure. Alternatively, the bottom electrode 302 may be formed of a different material than the top electrode 304 and therefore, the semiconductor structure 300 may be an asymmetric stack structure. Those skilled in the art appreciate that each of the bottom electrode 302, the high-K dielectric material 303, and the top electrode 304 may be formed using conventional techniques and, therefore, is not described in detail herein.

Accordingly, disclosed is a semiconductor structure comprising a first electrode over a substrate, a high-K dielectric material over the first electrode, and a second electrode over the high-K dielectric material. At least one of the first electrode and the second electrode comprises a material selected from the group consisting of a molybdenum nitride ($Mo_aN_b$) material, a molybdenum oxynitride ($MoO_xN_y$) material, and a molybdenum-based alloy material comprising molybdenum and nitrogen.

Figure 4:
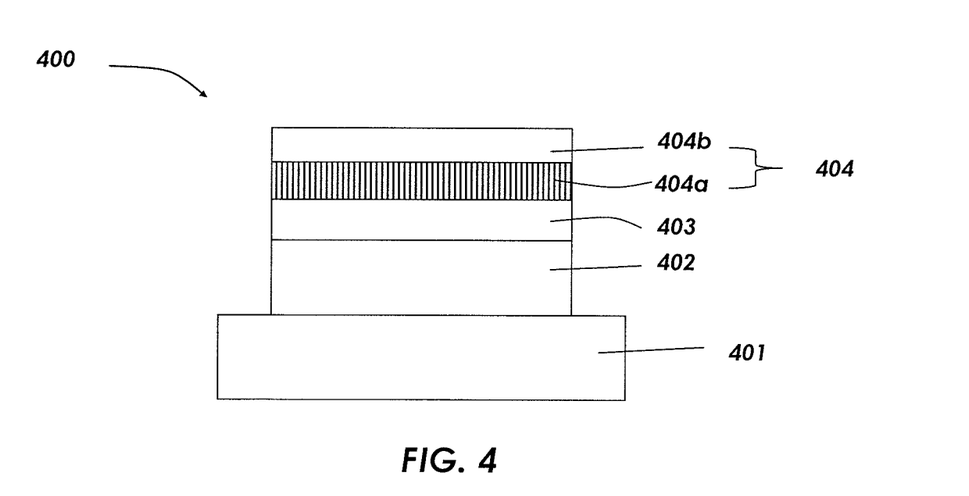

FIG. 4 shows an additional embodiment of a semiconductor structure 400. The semiconductor structure 400 may include a substrate 401, a bottom electrode 402 over the substrate 401, a top electrode 404, and a high-K dielectric material 403 between the bottom electrode 402 and the top electrode 404, wherein the top electrode 404 includes a lower portion 404a in direct contact with the high-K dielectric material 403, and an upper portion 404b over the lower portion 404a. The top electrode 404 may thus be a bilayer material. The bottom electrode 402 may be formed over the substrate 401. The bottom electrode 402 may be any conventional electrode material. The high-K dielectric material 403 may be formed over the bottom electrode 402. The high-K dielectric material 403 may be any conventional high-K dielectric material. Optionally, the bottom electrode 402 may be subjected to an annealing process prior to the formation of the high-K dielectric material 403. Then, the lower portion 404a of the top electrode 404 may formed over and in direct contact with the high-K dielectric material 403. The lower portion 404a of the top electrode 404 may include $MoO_xN_y$ material, $Mo_aN_b$ material, or Mo-based alloy material. Next, the upper portion 404b of the top electrode 404 may formed over the lower portion 404a to provide the semiconductor structure 400. The upper portion 404b of the top electrode 404 may be a conventional electrode material. Each of the bottom electrode 402, the high-K dielectric material 403, and the lower portion 404a and the upper portion 404b of the top electrode 404 may be formed using conventional techniques and, therefore, is not described in detail herein.

Figure 5:
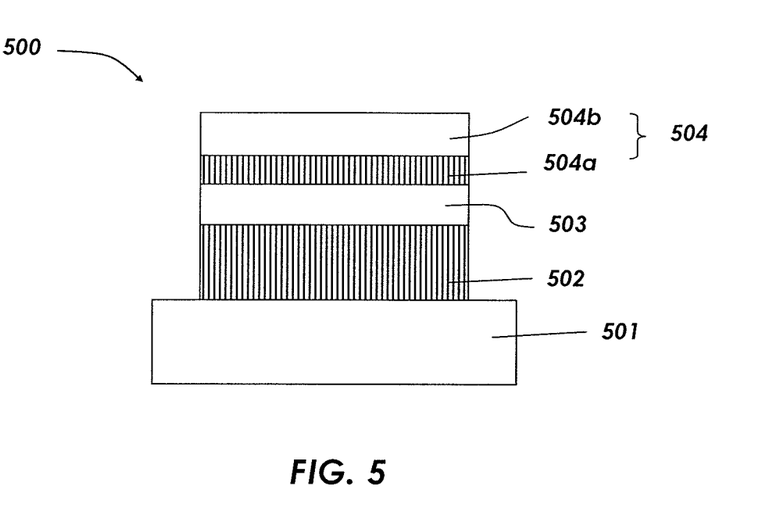

FIG. 5 shows yet still another embodiment of a semiconductor structure 500. The semiconductor structure 500 may include a substrate 501, a bottom electrode 502 over the substrate 501, a top electrode 504, and a high-K dielectric material 503 between the bottom electrode 502 and the top electrode 504, wherein the top electrode 504 includes a lower portion 504a in direct contact with the high-K dielectric material 503, and an upper portion 504b over the lower portion 504a. The bottom electrode 502 may be formed over the substrate 501. The bottom electrode 502 may include a material selected from the group consisting of $MoO_xN_y$ material, $Mo_aN_b$ material, $MoO_x$ material, and Mo-based alloy material. The high-K dielectric material 503 may be formed over the bottom electrode 502. The high-K dielectric material 503 may be a conventional high-K dielectric material. Optionally, the bottom electrode 502 may be subjected to an annealing process prior to the formation of the high-K dielectric material 503. Then, the lower portion 504a of the top electrode 504 may formed over and in direct contact with the high-K dielectric material 503. The lower portion 504a of the top electrode 504 may include $MoO_xN_y$ material, $Mo_aN_b$ material, $MoO_x$ material, or Mo-based alloy material. Next, the upper portion 504b of the top electrode 504 may be formed over the lower portion 504a to provide the semiconductor structure 500. The upper portion 504b of the top electrode 504 may be a conventional electrode material. Each of the bottom electrode 502, the high-K dielectric material 503, and the lower portion 504a and the upper portion 504b of the top electrode 504 may be formed using conventional techniques and, therefore, is not described in detail herein.

Accordingly, disclosed is a semiconductor structure comprising a first electrode over a substrate, a high-K dielectric material over the first electrode, and a second electrode over the high-K dielectric material. The second electrode comprises a lower portion in direct contact with the high-K dielectric material and an upper portion over the lower portion. The lower portion of the second electrode comprises a material selected from the group consisting of a molybdenum nitride material, a molybdenum oxynitride material, and a molybdenum-based alloy material comprised of molybdenum and nitrogen elements.

Figure 6:
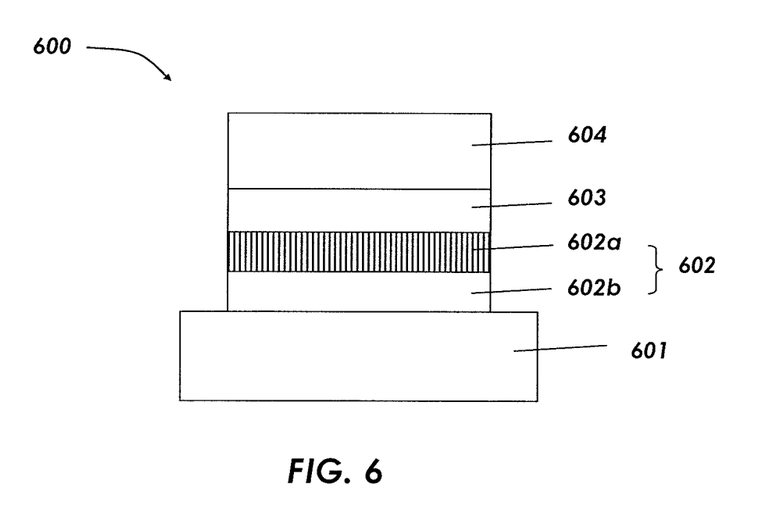

FIG. 6 shows yet another embodiment of a semiconductor structure 600. The semiconductor structure 600 may include a substrate 601, a bottom electrode 602 over the substrate 601, a top electrode 604, and a high-K dielectric material 603 between the bottom electrode 602 and the top electrode 604, wherein the bottom electrode 602 includes a lower portion 602b and an upper portion 602a over the lower portion 602b and in direct contact with the high-K dielectric material 603. The lower portion 602b of the bottom electrode 602 may be formed over the substrate 601. The lower portion 602b of the bottom electrode 602 may be any conventional electrode material. Then, the upper portion 602a of the bottom electrode 602 may be formed over the lower portion 602b. The upper portion 602a of the bottom electrode 602 may include a material selected from the group consisting of $MoO_xN_y$ material, $Mo_aN_b$ material, $MoO_x$ material, and Mo-based alloy material. Then, the high-K dielectric material 603 may be formed over and in direct contact with the upper portion 602a of the bottom electrode 602. The high-K dielectric material 603 may be any conventional high-K dielectric material. Next, the top electrode 604 may formed over the high-K dielectric material 603 to provide the semiconductor structure 600. The top electrode 604 may be any conventional electrode material. Each of the bottom electrode 602 (the lower portion 602b and the upper portion 602a), the high-K dielectric material 603, and the top electrode 604 may be formed using conventional techniques and, therefore, is not described in detail herein.

Figure 7:
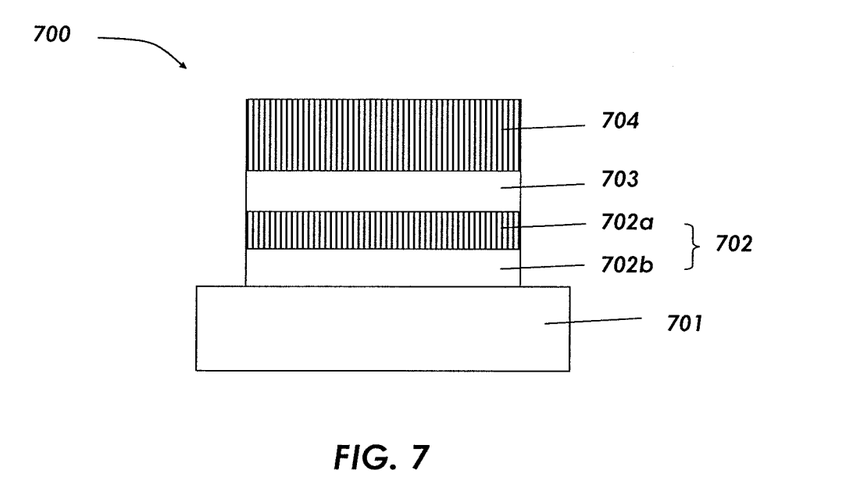

FIG. 7 shows an additional embodiment of a semiconductor structure 700. The semiconductor structure 700 may include a substrate 701, a bottom electrode 702 over the substrate 701, a top electrode 704, and a high-K dielectric material 703 between the bottom electrode 702 and the top electrode 704, wherein the bottom electrode 702 includes a lower portion 702b and an upper portion 702a over the lower portion 702b and in direct contact with the high-K dielectric material 703. The lower portion 702b of the bottom electrode 702 may be formed over the substrate 701. The lower portion 702b of the bottom electrode 702 may be any conventional electrode material. Then, the upper portion 702a of the bottom electrode 702 may be formed over the lower portion 702b. The upper portion 702a of the bottom electrode 702 may include a material selected from the group consisting of $MoO_xN_y$ material, $Mo_aN_b$ material, $MoO_x$ material, and Mo-based alloy material. The high-K dielectric material 703 may be formed over and in direct contact with the upper portion 702a of the bottom electrode 702. The high-K dielectric material 703 may be any conventional high-K dielectric material. Next, the top electrode 704 may be formed over the high-K dielectric material 703 to provide the semiconductor structure 700. The top electrode 704 may include a material selected from the group consisting of $MoO_xN_y$ material, $Mo_aN_b$ material, $MoO_x$ material, and Mo-based alloy material. Each of the bottom electrode 702 (the lower portion 702b and the upper portion 702a), the high-K dielectric material 703, and the top electrode 704 may be formed using any techniques and, therefore, is not described in detail herein.

Accordingly, disclosed is a semiconductor structure comprising a first electrode over a substrate, a high-K dielectric material over the first electrode, and a second electrode over the high-K dielectric material. The first electrode comprises an upper portion in direct contact with the high-K dielectric material and a lower portion. The upper portion of the first electrode comprises a material selected from the group consisting of a molybdenum nitride material, a molybdenum oxynitride material, a molybdenum oxide material, and a molybdenum-based alloy material comprised of molybdenum and nitrogen elements.

Figure 8:
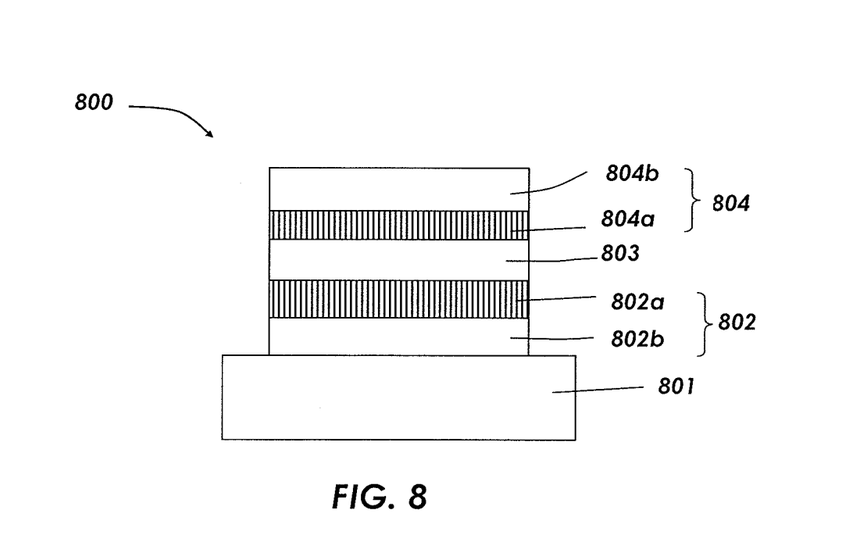

In some embodiments, the semiconductor structure may have a structure as shown in FIG. 8. A semiconductor structure 800 includes a bottom electrode 802 over a substrate 801, a top electrode 804, and a high-K dielectric material 803 between the bottom electrode 802 and top electrode 804. The top electrode 804 includes a lower portion 804a in direct contact with the high-K dielectric material 803, and an upper portion 804b over the lower portion 804a. The lower portion 804a of the top electrode 804 may include $MoO_xN_y$ material, $Mo_aN_b$ material, $MoO_x$ material or Mo-based alloy material. The upper portion 804b of the top electrode 804 may be any conventional electrode material. The bottom electrode 802 includes a lower portion 802b and an upper portion 802a over the lower portion 802b and in direct contact with the high-K dielectric material 803, wherein the upper portion 802a of the bottom electrode 802 may include $MoO_xN_y$ material, $Mo_aN_b$ material, $MoO_x$ material or Mo-based alloy material. The lower portion 802b of the bottom electrode 802 may be any conventional electrode material. The high-K dielectric material 803 may be any conventional high-K dielectric material. The semiconductor structure 800 may have an asymmetric stack structure, wherein the top electrode and the bottom electrode are formed from different materials. Alternatively, the semiconductor structure 800 may have a symmetric stack structure, wherein the top electrode and the bottom electrode are formed from the same material.

Accordingly, disclosed is a semiconductor structure comprising a first electrode over a substrate, a high-K dielectric material over the first electrode, and a second electrode over the high-K dielectric material. The first electrode comprises an upper portion in direct contact with the high-K dielectric material and a lower portion. The upper portion of the first electrode comprises a material selected from the group consisting of a molybdenum nitride ($Mo_aN_b$) material, a molybdenum oxynitride ($MoO_xN_y$) material, a molybdenum oxide ($MoO_x$) material, and a molybdenum-based alloy material comprised of molybdenum and nitrogen elements. The second electrode comprises a lower portion in direct contact with the high-K dielectric material and an upper portion over the lower portion. The lower portion of the second electrode comprises a material selected from the group consisting of a molybdenum nitride ($Mo_aN_b$) material, a molybdenum oxynitride ($MoO_xN_y$) material, a molybdenum oxide ($MoO_x$) material, and a molybdenum-based alloy material comprised of molybdenum and nitrogen elements.

In the embodiments as shown in FIGS. 4-8, the $MoO_xN_y$ material, $Mo_aN_b$ material, $MoO_x$ material, or Mo-based alloy material may function as an interface material between the electrode material and the high-K dielectric material. The interface material may have a thickness of at least about 3 Å. In some embodiments, the thickness of the interface material may be at least about 10 Å. In some embodiments, the thickness of the interface material may be at least about 30 Å. In some embodiments, the thickness of the interface material may be from about 3 Å to about 50 Å.

Accordingly, disclosed is a semiconductor structure comprising a first electrode over a substrate, a high-K dielectric material over the first electrode, and a second electrode over the high-K dielectric material. At least one of the first electrode and the second electrode comprises a first portion in direct contact with the high-K dielectric material and a second portion. The first portion comprises a material selected from the group consisting of a molybdenum nitride ($Mo_aN_b$) material, a molybdenum oxynitride ($MoO_xN_y$) material, a molybdenum oxide ($MoO_x$) material, and a molybdenum-based alloy material comprising molybdenum and nitrogen.

Accordingly, disclosed is a method of forming a semiconductor structure comprising forming a first electrode over a substrate, forming a high-K dielectric material over the first electrode, and forming a second electrode over the high-K dielectric material. At least one of the first electrode and the second electrode comprises a material selected from the group consisting of a molybdenum nitride ($Mo_aN_b$) material, a molybdenum oxynitride ($MoO_xN_y$) material, and a molybdenum-based alloy material comprising molybdenum and nitrogen.

When at least one electrode of the semiconductor structure includes $MoO_xN_y$ material, the semiconductor structure may show unexpectedly improved capacitance, in addition to reduced current leakage. Without being limited by theory, it is believed that the $MoO_xN_y$ material may act as an oxygen reservoir for the high-K dielectric material. The oxygen in the $MoO_xN_y$ material may be used to repair or reduce oxygen vacancies in the high-K dielectric material, an interfacial capacitive "dead-layer" phenomenon that causes the reduction of capacitance in the semiconductor structure. By way of non-limiting example, the semiconductor structure that includes an electrode comprising $MoO_xN_y$ material and a high-K dielectric material comprising $SrTiO_3$ or $ZrO_2$ may show about 15% increase in the capacitance, in addition to reduced current leakage. As a result, the semiconductor structure may show enhanced work function and capacitance, yet reduced current leakage. This unexpected and surprising reduction of the interfacial capacitive "dead-layer" is highly desirable, especially when coupled with reduced leakage.

In some embodiments, the semiconductor structures may be further processed by conventional techniques to form memory devices, such as Dynamic Random Access Memory (DRAM) devices. Furthermore, the semiconductor structures may be used in metal-insulator-metal cell designs for Dynamic Random Access Memory (DRAM MIM) applications. In the DRAM devices, use of the molybdenum nitride ($Mo_aN_b$) material, molybdenum oxynitride ($MoO_xN_y$) material, or molybdenum-based alloy material comprising molybdenum and nitrogen as the material for the second electrode may provide improved capacitance, lower current leakage, or both. In the DRAM devices, use of the molybdenum nitride ($Mo_aN_b$) material, molybdenum oxynitride ($MoO_xN_y$) material, or molybdenum-based alloy material comprising molybdenum and nitrogen as the material for the lower portion of the second electrode may provide improved capacitance, lower current leakage, or both.

In some embodiments, the semiconductor structures may be further processed by conventional techniques to form NAND devices. The molybdenum nitride ($Mo_aN_b$) material, molybdenum oxynitride ($MoO_xN_y$) material, or molybdenum-based alloy material comprising molybdenum and nitrogen may be used in the NAND control gate, such as the material for the second electrode or the material for the upper portion of the second electrode. The NAND devices may have an improved high-voltage leakage performance, improving erase saturation of the NAND devices. Furthermore, the semiconductor structure may have an improved equivalent oxide thickness (EOT), resulting in an enhancement in both write VgVt and erase VwVt slope of the NAND devices via capacitive coupling. Therefore, the NAND devices having the semiconductor structure may exhibit improved retention (such as improved charge loss to the control gate) due to an improved EOT and an improved effective work function.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A semiconductor structure, comprising:
a first electrode over a substrate, the first electrode comprising a first portion over the substrate and a second portion over the first portion, the first portion comprising a different material than the second portion, the material of the second portion selected from the group consisting of a molybdenum nitride ($Mo_aN_b$) material, a molybdenum oxynitride ($MoO_xN_y$) material, and a molybdenum-based alloy material comprising molybdenum and nitrogen;
a high-K dielectric material in direct contact with the second portion of the first electrode; and
a second electrode over the high-K dielectric material, a material of the second electrode selected from the group consisting of ruthenium dioxide, iridium oxide, molybdenum oxide, tungsten oxide, chromium oxide, manganese oxide, tin oxide, cobalt oxide, titanium nitride, tantalum nitride, and combinations thereof.

2. The semiconductor structure of claim 1, wherein the molybdenum-based alloy material comprising molybdenum and nitrogen comprises a material selected from the group consisting of molybdenum aluminum nitride (MoAlN), molybdenum aluminum oxynitride (MoAlON), molybdenum titanium nitride (MoTiN), molybdenum aluminum titanium nitride (MoAlTiN), molybdenum niobium nitride (MoNbN), molybdenum zirconium nitride (MoZrN), molybdenum silicon nitride (MoSiN), molybdenum tantalum nitride (MoTaN), and molybdenum hafnium nitride (MoHfN).

3. The semiconductor structure of claim 1, wherein the high-K dielectric material comprises a material selected from the group consisting of $ZrO_2$, $HfO_2$, $SrTiO_3$, $TiO_2$, $BaSrTiO_x$, $HfSiO_x$, $Nb_2O_5$, $PbZrTiO_x$, SiON, and $Ta_2O_5$.

4. The semiconductor structure of claim 1, wherein the high-K dielectric material further comprises a dopant.

5. The semiconductor structure of claim 4, wherein the dopant comprises an element selected from the group consisting of Al, Ce, Co, Er, Ga, Gd, Ge, Hf, In, La, Lu, Mg, Mn, Nd, Pr, Sc, Si, Sn, Sr, Y, and Zr.

6. The semiconductor structure of claim 1, wherein the second portion of the first electrode comprises a different material than the second electrode.

7. The semiconductor structure of claim 1, wherein:
the first portion of the first electrode is in direct contact with the high-K dielectric material, the material of the first portion selected from the group consisting of a molybdenum nitride ($Mo_aN_b$) material, a molybdenum oxynitride ($MoO_xN_y$) material, and a molybdenum-based alloy material comprising molybdenum and nitrogen.

8. A semiconductor structure, comprising:
a first electrode over a substrate, a material of the first electrode selected from the group consisting of ruthenium dioxide, iridium oxide, molybdenum oxide, tungsten oxide, chromium oxide, manganese oxide, tin oxide, cobalt oxide, titanium nitride, tantalum nitride, and combinations thereof;
a high-K dielectric material over the first electrode; and
a second electrode over the high-K dielectric material, wherein the second electrode comprises a lower portion in direct contact with the high-K dielectric material and an upper portion over the lower portion, the upper portion comprising a different material than the lower portion, the material of the lower portion selected from the group consisting of a molybdenum nitride ($Mo_aN_b$) material, a molybdenum oxynitride ($MoO_xN_y$) material, and a molybdenum-based alloy material comprising molybdenum and nitrogen.

9. The semiconductor structure of claim 8, wherein the upper portion of the second electrode comprises a material selected from the group consisting of ruthenium (Ru) metal, ruthenium dioxide ($RuO_2$), titanium nitride (TiN), and tantalum nitride (TaN).

10. The semiconductor structure of claim 8, wherein the upper portion of the second electrode comprises a material selected from the group consisting of a metal, metal alloy, conductive metal oxide, conductive metal silicide, conductive metal carbide, conductive metal nitride, and combinations thereof.

11. The semiconductor structure of claim 8, wherein the high-K dielectric material comprises a material selected from the group consisting of $TiO_2$, $ZrO_2$, $HfO_2$, and $SrTiO_3$.

12. A method of forming a semiconductor structure, comprising:
forming a first electrode over a substrate by a process comprising:
forming a first portion of the first electrode over the substrate; and
forming a second portion of the first electrode over the first portion of the first electrode, the second portion comprising a different material than the first portion, the material of the second portion selected from the group consisting of a molybdenum nitride ($Mo_aN_b$) material, a molybdenum oxynitride ($MoO_xN_y$) material, and a molybdenum-based alloy material comprising molybdenum and nitrogen;
forming a high-K dielectric material in direct contact with the second portion of the first electrode; and
forming a second electrode over the high-K dielectric material, a material of the second electrode selected from the group consisting of ruthenium dioxide, iridium oxide, molybdenum oxide, tungsten oxide, chromium oxide, manganese oxide, tin oxide, cobalt oxide, titanium nitride, tantalum nitride, and combinations thereof.

13. The method of claim 12, further comprising annealing the first electrode prior to forming the high-K dielectric material over the first electrode.

14. A semiconductor structure, comprising:
a first electrode over a substrate, the first electrode comprising a first portion over the substrate and a second portion over the first portion, a material of the first portion selected from the group consisting of ruthenium dioxide, iridium oxide, molybdenum oxide, tungsten oxide, chromium oxide, manganese oxide, tin oxide, cobalt oxide, titanium nitride, tantalum nitride, and combinations thereof and a material of the second portion selected from the group consisting of a molybdenum nitride ($Mo_aN_b$) material, a molybdenum oxynitride ($MoO_xN_y$) material, and a molybdenum-based alloy material comprising molybdenum and nitrogen;
a high-K dielectric material in direct contact with the second portion of the first electrode; and
a second electrode over the high-K dielectric material, the second electrode comprising a first portion over the high-K dielectric material and a second portion over the first portion, a material of the first portion selected from the group consisting of a molybdenum nitride ($Mo_aN_b$) material, a molybdenum oxynitride ($MoO_xN_y$) material, and a molybdenum-based alloy material comprising molybdenum and nitrogen and a material of the second portion selected from the group consisting of ruthenium dioxide, iridium oxide, molybdenum oxide, tungsten oxide, chromium oxide, manganese oxide, tin oxide, cobalt oxide, titanium nitride, tantalum nitride, and combinations thereof.

15. The semiconductor structure of claim 14, wherein the second portion of the first electrode comprises the same material as the first portion of the second electrode.

\* \* \* \* \*